(12) United States Patent
Chol et al.

(10) Patent No.: US 7,289,379 B2
(45) Date of Patent: Oct. 30, 2007

(54) MEMORY DEVICES AND METHODS OF OPERATION THEREOF USING INTERDEPENDENT SENSE AMPLIFIER CONTROL

(75) Inventors: Hye-In Chol, Gyeonggi-do (KR); Kye-Hyun Kyung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 143 days.

(21) Appl. No.: 11/327,877

(22) Filed: Jan. 9, 2006

(65) Prior Publication Data

US 2006/0171225 A1     Aug. 3, 2006

(30) Foreign Application Priority Data

Feb. 2, 2005     (KR)     ............ 10-2005-0009373

(51) Int. Cl.
G11C 7/22    (2006.01)
G11C 7/06    (2006.01)
G11C 7/08    (2006.01)
G11C 8/02    (2006.01)

(52) U.S. Cl. ............ 365/196; 365/207; 365/233; 365/189.02; 365/185.21

(58) Field of Classification Search ........... 365/230.03, 365/189.02, 185.13, 185.21, 205, 207, 195, 365/196, 227, 233, 233.5
See application file for complete search history.

(56) References Cited

U.S. PATENT DOCUMENTS

| 5,883,851 | A | | 3/1999 | Lee | |
|---|---|---|---|---|---|
| 5,982,674 | A | * | 11/1999 | Lines et al. | 365/189.02 |
| 6,414,898 | B1 | * | 7/2002 | Chien | 365/230.06 |
| 6,442,089 | B1 | * | 8/2002 | Fletcher et al. | 365/207 |
| 6,504,766 | B1 | * | 1/2003 | Pilo et al. | 365/189.01 |
| 6,876,595 | B2 | * | 4/2005 | Bhavnagarwala et al. | 365/230.06 |
| 6,930,941 | B2 | * | 8/2005 | Nakase | 365/205 |
| 6,937,535 | B2 | * | 8/2005 | Ahn et al. | 365/222 |
| 2006/0028888 | A1 | * | 2/2006 | Shin et al. | 365/205 |

* cited by examiner

*Primary Examiner*—J. H. Hur
(74) *Attorney, Agent, or Firm*—Myers Bigel Sibley & Sajovec, PA.

(57) ABSTRACT

A memory device includes a control circuit configured to disable a local input/output line sense amplifier responsive to a global input/output line sense amplifier enable signal. The device may further include a column select gate configured to control transfer of data from a memory cell to the local input/output line and the control circuit may be configured to disable transfer of data via the column select gate responsive to the global input/output line sense amplifier enable signal.

14 Claims, 4 Drawing Sheets

MEMORY DEVICES AND METHODS OF OPERATION THEREOF USING INTERDEPENDENT SENSE AMPLIFIER CONTROL

CROSS-REFERENCE TO RELATED APPLICATION

This application claims the benefit of Korean Patent Application No. 10-2005-0009373, filed Feb. 2, 2005, the disclosure of which is hereby incorporated herein by reference in its entirety.

BACKGROUND OF THE INVENTION

The present invention relates to semiconductor memory devices, and more particularly, to sense amplifier circuitry and methods of operation thereof in volatile semiconductor memory devices, such as dynamic random access memory (DRAM) devices.

Generally, in high-efficiency electronic systems, such as personal computers or electronic communication devices, volatile semiconductor memory devices, such as DRAM, used therein have increased in speed and degree of integration. For semiconductor memory devices used in battery-operated systems, such as hand-held phones or laptop computers, low power consumption characteristics are generally desired. Accordingly, semiconductor manufacturers have made efforts to reduce operating current and standby current in memory devices for mobile applications.

Controlling an input/output line sense amplifier in a read operation of a semiconductor memory device, such as a DRAM, may be important from operational speed and power consumption points of view. For example, it may be desirable to activate an input/output line sense amplifier only until data is sufficiently developed on a data line connected to the input/output line sense amplifier after assertion of a column selection signal. In particular, an enable section of the column selection signal or an enable section of the local sense amplifier may not be required after the input/output line sense amplifier is activated, and therefore, if the column selection gate or local sense amplifier is still in the active stage, current may be unnecessarily consumed.

FIG. 1 shows a block diagram of a readout circuit in a conventional semiconductor memory device. With reference to FIG. 1, blocks of the readout circuit include three sense amps 10, 20, 40 connected in a data path of a memory cell 2. FIG. 2 shows a timing diagram of a readout operation of the circuit of FIG. 1.

When a row address is externally applied for a read operation of a DRAM element, a word line WL selected by a row decoder is enabled. When the selected WL is enabled, data stored in a storage capacitor C1 of the memory cell is developed on a bit line BL through an access transistor T1. The data developed on the bit line is sensed and amplified by an operation of a bit line sense amplifier 10. Eventually, charge stored in storage capacitor C1 is sensed and amplified as high or low data by the bit line sense amplifier 10. When a column address is applied together with a read command after activation of the bit line sense amplifier 10, a column selection line CSL is enabled by a column selector 5. Column selection gates G1, G2 are turned ON so that the data output from the bit line sense amplifier 10 is transferred to a local input/output line pair LIO, LIOB. For example, if the data of the bit line BL is high, a high is generated on the local input/output line LIO, and if the data of the bit line BL is low, a high is generated on the complementary local input/output line LIOB.

In response to a local input/output line sense amplifier enable signal LSAEN, a local input/output line sense amplifier 20 senses and amplifies the data on the local input/output line pair LIO, LIOB and transfers it to a global input/output line pair GIO, GIOB. The data transferred to the global input/output line pair GIO, GIOB is sensed and amplified by a global input/output line sense amplifier 40 responding to a global input/output line sense amplifier enable signal FRP and is output as a read data RD. The read data RD is transferred to a pipeline at a CMOS level, and the data transferred to the pipeline passes through a series of pipelines and an output driver. The data passing through the output driver is transferred to an external element, such as a chipset, though data pins.

With reference to FIG. 2, the column selection signal CSL and the local sense amplifier enable signal LSAEN are enabled as shown by the arrows A2, A1 in relation to a real read command clock pad_ck. These signals are disabled as shown by the arrows A3, A4 in relation to the clock pad_ck. An important factor for the readout of data is the margin of the column selection signal CSL and the local input/output line sense amplifier enable signal LSAEN with respect to the global input/output line sense amplifier enable signal FRP. That is, data to be read may be ensured to be loaded on a data line pair by securing the margin in periods A, X. In the period Y of FIG. 2, the global input/output line sense amplifier 40 typically is activated and performs a sensing and amplifying operation while the local input/output line sense amplifier 20 is activated. However, in the period Y, the local input/output line sense amplifier 20 does not need to be driven because the read data RD has already been output. Consequently, current may be unnecessarily consumed by driving the local input/output line sense amplifier 20 unnecessarily. Furthermore, in the period B, the column selection gates G1, G2 may be unnecessarily activated.

Therefore, techniques for reducing or minimizing current in a read operation without degrading the performance of the semiconductor memory device are desirable.

SUMMARY OF THE INVENTION

In accordance with some embodiments of the present invention, readout circuits in a semiconductor memory device includes a local input/output line sense amplifier of sensing and amplifying data output from a bit line sense amplifier, in response to a local sense amplifier enable signal; a global input/output line sense amplifier of sensing and amplifying data output from the local input/output line sense amplifier, in response to a global sense amplifier enable signal; and a disable control unit of generating a disable control signal to disable the local input/output line sense amplifier, in response to the global sense amplifier enable signal.

In accordance with further embodiments of the present invention, disable control methods in a readout circuit in a semiconductor memory device including a local input/output line sense amplifier of sensing and amplifying data output from a bit line sense amplifier in response to a local sense amplifier enable signal, and a global input/output line sense amplifier of sensing and amplifying data output from the local input/output line sense amplifier in response to a global sense amplifier enable signal, includes disabling the local input/output line sense amplifier, corresponding to a combination of the global sense amplifier enable signal and a column selection line disable signal; and disabling a column selection gate connected between the bit line sense amplifier and the local input/output line sense amplifier after disabling the local input/output line sense amp. According to some embodiments of the present invention, current consumed in the local sense amplifier and the column section gate may be reduced.

In some embodiments of the present invention, a memory device includes a memory cell, a local input/output line and memory circuitry configured to transfer data from the memory cell to the local input/output line. The device also includes a local input/output line sense amplifier configured to sense and amplify data on the local input/output line, a global input/output line configured to receive the sensed and amplified data, and a global input/output line sense amplifier configured to sense and amplify data on the global input/output line responsive to a global input/output line sense amplifier enable signal. The device further includes a control circuit configured to disable the local input/output line sense amplifier responsive to the global input/output line sense amplifier enable signal.

In some embodiments, the local input/output line sense amplifier is configured to sense and amplify data on the local input/output line responsive to a local input/output line sense amplifier enable signal, and the control circuit is configured to control the local input/output line sense amplifier enable signal responsive to the global input/output line sense amplifier enable signal. The memory circuitry may further include a column select gate configured to control transfer of data from the memory cell to the local input/output line. The memory device may further include a column selector circuit configured to control the column select gate responsive to a control signal and a sense amplifier enable signal generator circuit configured to generate the local input/output line sense amplifier enable signal responsive to the control signal. The control circuit may be configured to generate the control signal responsive to the global input/output line sense amplifier enable signal.

In further embodiments of the present invention, a memory device includes a memory cell, a local input/output line and a column select gate configured to control transfer of data from the memory cell to the local input/output line. The device also includes a local input/output line sense amplifier configured to sense and amplify data on the local input/output line in response to a local input/output line sense amplifier enable signal, a global input/output line configured to receive the sensed and amplified data and a global input/output line sense amplifier configured to sense and amplify the data on the global input/output line responsive to a global input/output line sense amplifier enable signal. The device further includes a control circuit configured to disable transfer of data via the column select gate responsive to the global input/output line sense amplifier enable signal. In some embodiments, the device further includes a column selector circuit configured to control the column select gate responsive to the global input/output line sense amplifier enable signal.

In additional embodiments of the present invention, a memory device includes a memory cell, a local input/output line and a column select gate configured to control transfer of data from the memory cell to the local input/output line. The device also includes a local input/output line sense amplifier configured to sense and amplify data on the local input/output line in response to a local input/output line sense amplifier enable signal, a global input/output line configured to receive the sensed and amplified data and a global input/output line sense amplifier configured to sense and amplify the data on the global input/output line responsive to a global input/output line sense amplifier enable signal. The device further includes a control circuit configured disable the local input/output line sense amplifier and disable data transfer via the column select gate responsive to the global input/output line sense amplifier enable signal.

In some embodiments, the local input/output line sense amplifier is configured to sense and amplify data on the local input/output line responsive to a local input/output line sense amplifier enable signal, and the control circuit is configured to control the local input/output line sense amplifier enable signal responsive to the global input/output line sense amplifier enable signal. The device may further include a column selector circuit configured to control the column select gate responsive to the global input/output line sense amplifier enable signal. The control circuit may include a NOR gate configured to NOR the global sense amplifier enable signal and a column selector disable signal and an inverter configured to invert an output of the NOR gate to produce an enable signal for the column selector circuit. The device may further include a local input/output line sense amplifier enable signal generator circuit that also receives the enable signal produced by the inverter and that generates the local input/output line sense amplifier enable signal responsive thereto.

Further embodiments of the present invention provide methods of operating a memory device that includes a memory cell, memory circuitry configured to transfer data from the memory cell to a local input/output line, a local input/output line sense amplifier configured to sense and amplify data on the local input/output line and a global input/output line sense amplifier configured to sense and amplify data produced on a global input/output line coupled to the local input/output line sense amplifier. The local input/output line sense amplifier is enabled to sense and amplify data on the local input/output line and thereby produce data on the global input/output line. The global input/output line sense amplifier is enabled to sense and amplify the data on the global input/output line. The local input/output line sense amplifier is disabled responsive to the enabling of the global input/output line sense amplifier.

Enabling of the global input/output line sense amplifier may include enabling the global input/output line sense amplifier responsive to a transition of a global input/output line sense amplifier enable signal. Disabling of the local input/output line sense amplifier responsive to the enabling of the global input/output line sense amplifier may include disabling the local input/output line sense amplifier responsive to the transition of the global input/output line sense amplifier enable signal. The memory circuitry may further include a column selection gate configured to enable and disable transfer of data to the local input/output line, and the method may further include disabling transfer of data via the column selection gate responsive to the enabling of the global input/output line sense amplifier. Enabling the global input/output line sense amplifier may include enabling the global input/output line sense amplifier responsive to a transition of a global input/output line sense amplifier enable signal, and disabling of transfer of data via the column selection gate responsive to the enabling of the global input/output line sense amplifier may include disabling transfer of data via the column selection gate responsive to the transition of the global input/output line sense amplifier enable signal.

DETAILED DESCRIPTION OF EMBODIMENTS OF THE INVENTION

Figure 1:
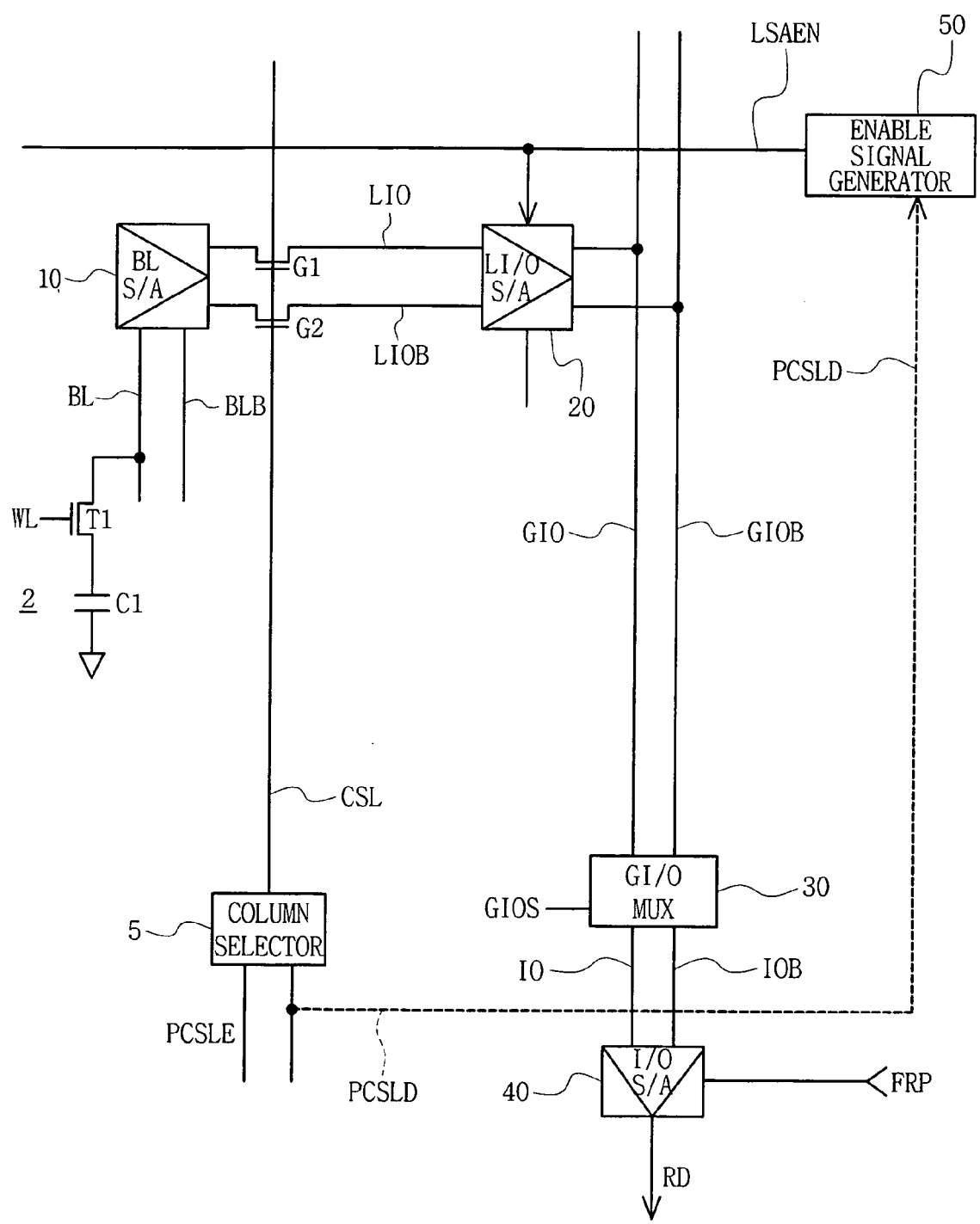
FIG. 1 is a block diagram of a readout circuit of a conventional semiconductor memory device.
Figure 2:
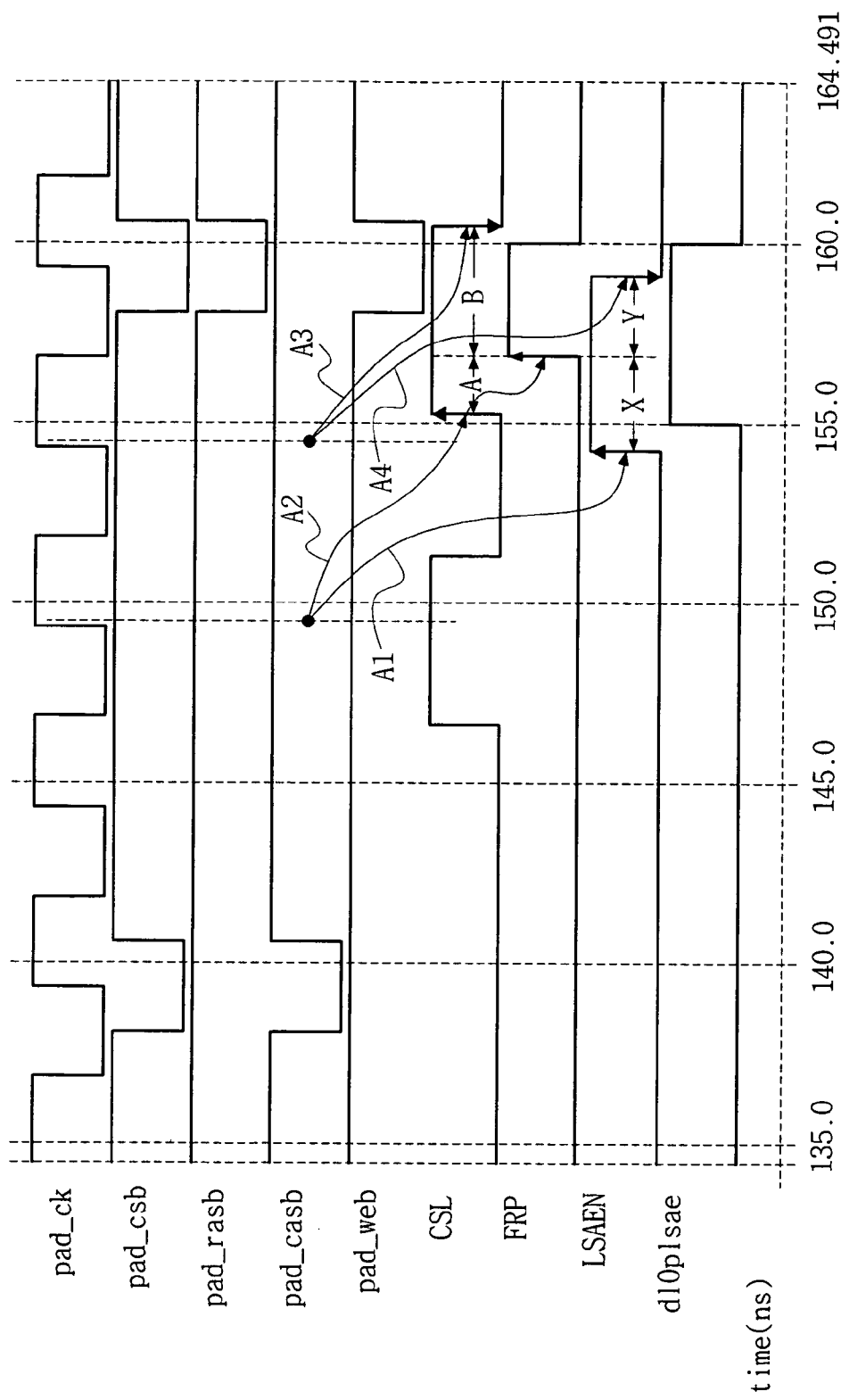
FIG. 2 is a timing diagram of a readout operation of the circuit of FIG. 1.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
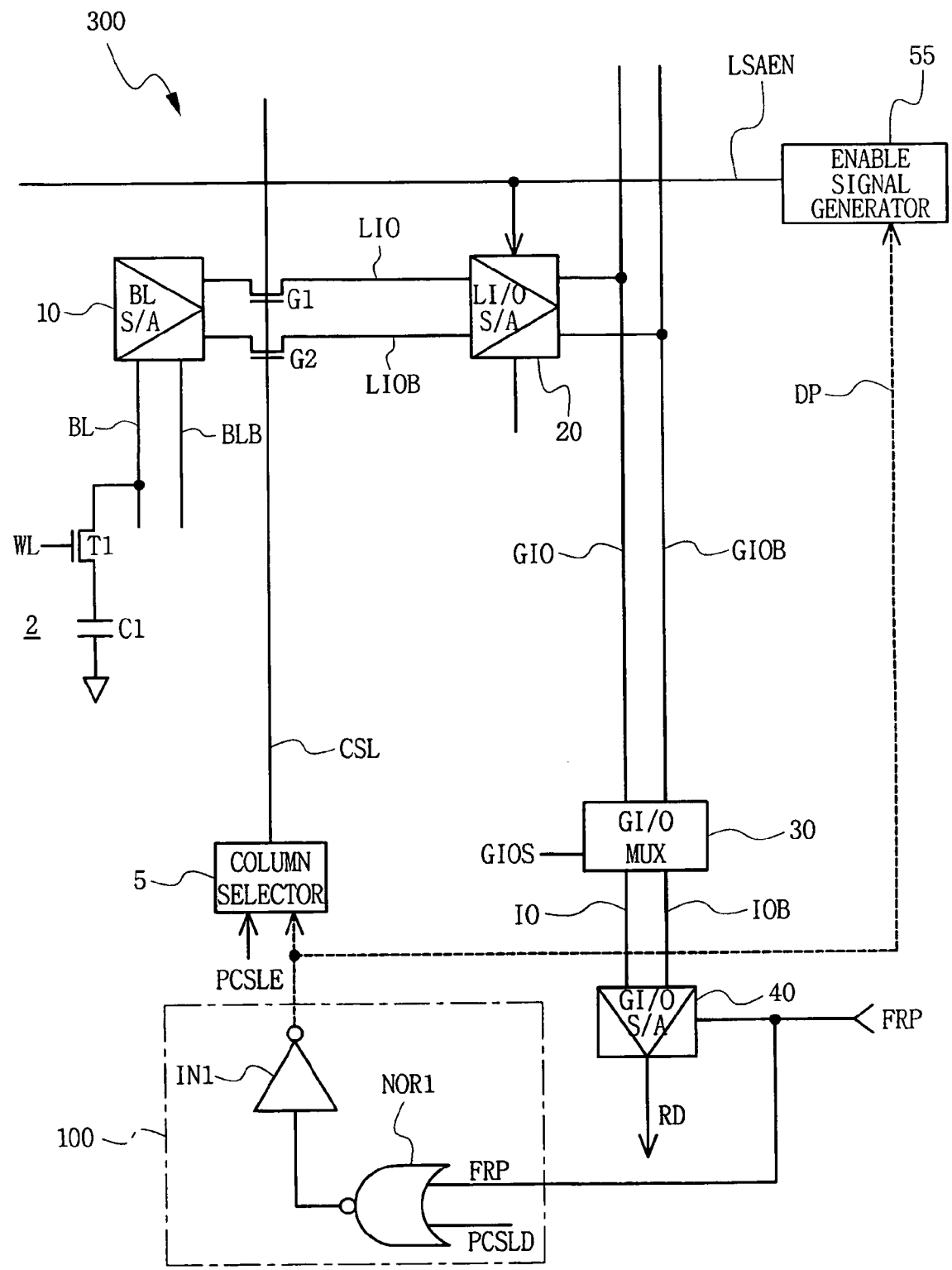
FIG. 3 is a block diagram illustrating a semiconductor memory device according to some embodiments of the present invention.
Figure 4:
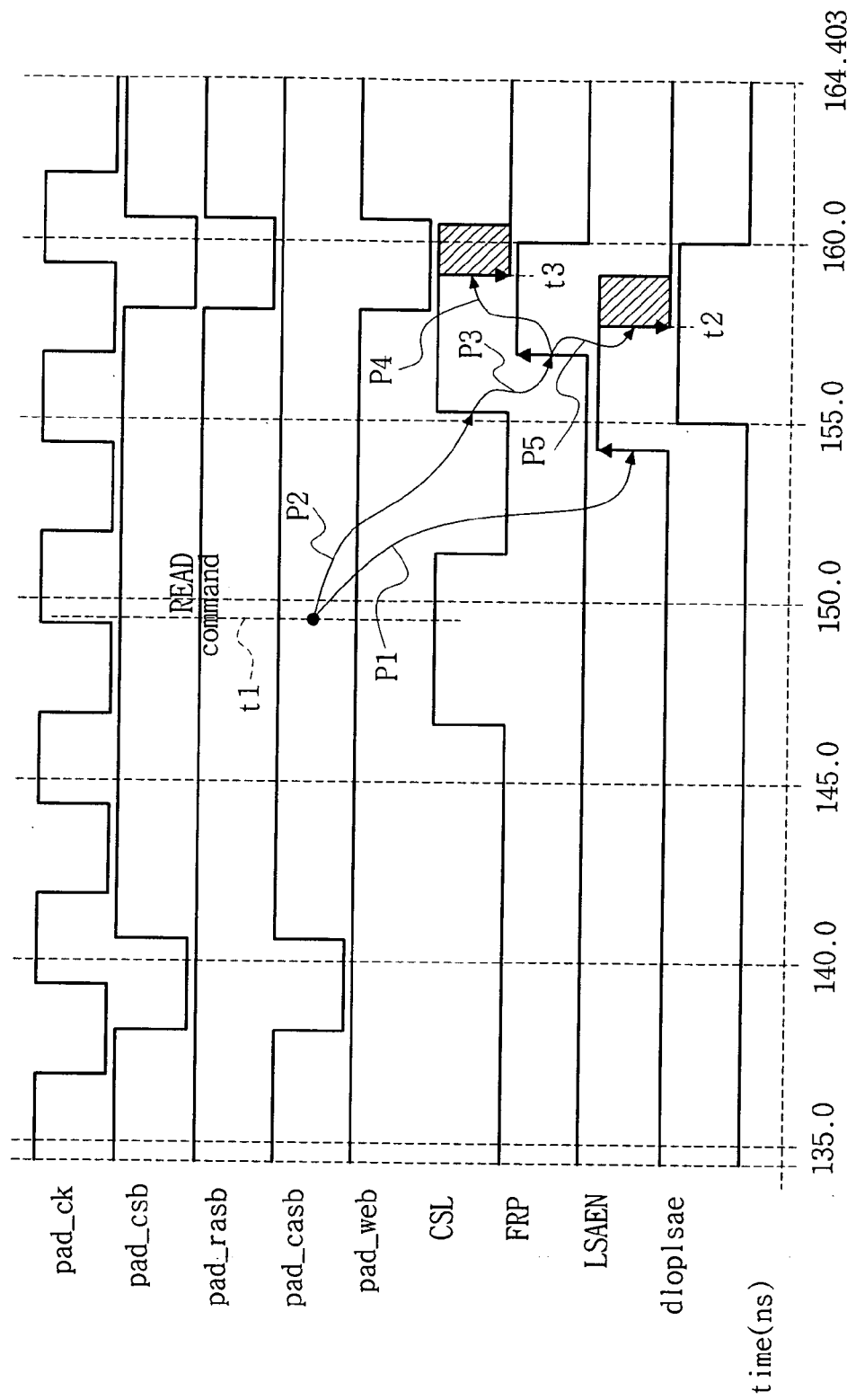
FIG. 4 is a timing diagram illustrating exemplary operations of the device of FIG. 3.

FIG. 3 is a block diagram illustrating a semiconductor memory device 300 according to some embodiments of the present invention. FIG. 4 is a timing diagram of exemplary operations of the device 300.

With reference to FIG. 3, the device 300 includes a memory cell 2, a bit line sense amplifier 10, a local input/output line sense amplifier 30, a global input/output (GI/O) sense amplifier 40, a column selector 5, an enable signal generator 55, a GI/O multiplexer (mux) 30, and a disable control circuit 100. An output terminal of the disable control circuit 100 is connected to the column selector 5 and the enable signal generator 55. The bit line sense amplifier 10 is connected to a bit line BL to which the memory cell 2 is connected, and the local input/output line sense amplifier 20 is connected to the bit line sense amplifier 10 by column selection gates G1, G2. The local input/output line sense amplifier 20 senses and amplifies data output from the bit line sense amplifier 10 in response to a local input/output line sense amplifier enable signal LSAEN. The global input/output line sense amplifier 40 is connected to a global input/output line pair GIO, GIOB by the GI/O multiplexer 30 senses and amplifies data output from the local input/output line sense amplifier 20, in response to a global input/output line sense amplifier enable signal FRP.

The disable control unit 100 generates a disable control signal DP responsive to the global input/output line sense amplifier enable signal FRP and a column selection line disable signal PCSLD, and activates the disable control signal such that the local input/output line sense amplifier 20 and the column selection gates G1, G2 are inactivated. In the illustrated embodiments, the disable control unit 100 comprises a NOR gate NOR1 that receives the global input/output line sense amplifier enable signal FRP and the column selection line disable signal PCSLD, and an inverter IN1 that inverts an output of the NOR gate NOR1.

When a row address for a read operation is applied, a word line WL selected by a row decoder (now shown) is enabled. When the selected word line is enabled, data stored in a storage capacitor C1 of a memory cell is developed on a bit line BL by an access transistor T1. The data developed on the bit line BL is sensed and amplified by an operation of the bit line sense amplifier 10. Consequently, charge stored in the storage capacitor C1 is sensed and amplified as high or low data by the bit line sense amplifier 10. When a column address is applied together with a read command after the activating operation of the bit line sense amplifier 10, a column selection line signal CSL as selected is enabled. The column selector 5 receives a column selection line enable signal PCSLE and makes the column selection line signal CSL to a high level. Then, the column selection gates G1, G2 are turned ON, so that data output from the bit line sense amplifier 10 is transferred to a local input/output line pair LIO, LIOB. For example, if the data of the bit line BL is high, a high level is developed on the local input/output line LIO, and if low, a high level is developed on the complementary input/output line LIOB. The local input/output line sense amplifier 20 senses and amplifies data on the local input/output line pair LIO, LIOB in response to the local input/output line sense amplifier enable signal LSAEN and transfers the data to the global input/output line pair GIO, GIOB. The local input/output line sense amplifier enable signal LSAEN is activated by the enable signal generator 55. The data transferred to the global input/output line pair GIO, GIOB is sensed and amplified by the global input/output line sense amplifier 40 in response to the global input/output line sense amplifier enable signal FRP and is output as a read data RD. The read data RD is transferred to a pipeline at a CMOS level, and the data transferred to the pipeline passes through a series of pipelines and an output driver. The data passing through the output driver is transferred to an external element, such as a chipset, through data pins.

In some embodiments of the present invention, the disable control circuit 100 may reduce current consumption upon a read operation. A disable control signal DP is generated by using the global input/output line sense amplifier enable signal FRP and the column selection line disable signal PCSLD, such that the generated disable control signal may inactivate the local input/output line sense amplifier 20 and the column selection gates G1, G2 faster, compared to the conventional operations. Exemplary operations according to some embodiments of the present invention may be understood with reference to FIG. 4.

FIG. 4 shows timing of a readout operation of the circuit according to FIG. 3. The global input/output line sense amplifier enable signal FRP participates in the path of disabling the column select line CSL and the local input/output line sense amplifier enable signal LSAEN. The column selection signal CSL and the local input/output line sense amplifier enable signal LSAEN are enabled as indicated by the arrows P2, P1, in relation to a real read command clock pad_ck, as shown in FIG. 4, and are disabled, as indicated by the arrows P5, P5, in response to the global input/output line sense amplifier enable signal FRP. The enable operation periods of the local input/output line sense amplifier 20 and the column selection gates G1, G2 are reduced by advancing the disable period while securing sufficient margin between the signals, the consumption of current in a read operation may be reduced. It is believed that, if the local input/output line sense amplifier enable signal LSAEN or the column selection signal CSL is disabled at the time that the global input/output line sense amplifier enable signal FRP is enabled, a reduction of current consumption of about 10% may be achieved.

If the local input/output line sense amplifier is disabled responsive to a combination of the global input/output line sense amplifier enable signal and the column selection line disable signal, then, when the column selection gate connected between the bit line sense amplifier and the local input/output line sense amplifier is disabled, a sufficient read operation margin may be secured while reducing unnecessary current consumption.

Those skilled in the art will appreciate that the present invention may be embodied in a number of different ways. The invention is not limited to the specific timing and circuits described above. As described above, according to various embodiments of the present invention, current consumption upon a read operation can be reduced by reducing an operation period of a readout circuit element. Therefore, for example, embodiments of the present invention may be used to reduce power consumption in mobile applications in which low power consumption is desirable.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A memory device, comprising:
   a memory cell;
   a local input/output line;
   memory circuitry configured to transfer data from the memory cell to the local input/output line;
   a local input/output line sense amplifier configured to sense and amplify data on the local input/output line;
   a global input/output line configured to receive the sensed and amplified data;
   a global input/output line sense amplifier configured to sense and amplify data on the global input/output line responsive to a global input/output line sense amplifier enable signal; and
   a control circuit configured to disable the local input/output line sense amplifier responsive to the global input/output line sense amplifier enable signal.

2. The memory device of claim 1, wherein the local input/output line sense amplifier is configured to sense and amplify data on the local input/output line responsive to a local input/output line sense amplifier enable signal, and wherein the control circuit is configured to control the local input/output line sense amplifier enable signal responsive to the global input/output line sense amplifier enable signal.

3. The memory device of claim 2:
   wherein the memory circuitry comprises a column select gate configured to control transfer of data from the memory cell to the local input/output line;
   wherein the memory device further comprises:
     a column selector circuit configured to control the column select gate responsive to a control signal; and
     a sense amplifier enable signal generator circuit configured to generate the local input/output line sense amplifier enable signal responsive to the control signal; and
   wherein the control circuit is configured to generate the control signal responsive to the global input/output line sense amplifier enable signal.

4. A memory device comprising:
   a memory cell;
   a local input/output line;
   a column select gate configured to control transfer of data from the memory cell to the local input/output line;
   a local input/output line sense amplifier configured to sense and amplify data on the local input/output line in response to a local input/output line sense amplifier enable signal;
   a global input/output line configured to receive the sensed and amplified data;
   a global input/output line sense amplifier configured to sense and amplify the data on the global input/output line responsive to a global input/output line sense amplifier enable signal; and
   a control circuit configured to disable transfer of data via the column select gate responsive to the global input/output line sense amplifier enable signal.

5. The memory device of claim 4, further comprising a column selector circuit configured to control the column select gate responsive to the global input/output line sense amplifier enable signal.

6. A memory device comprising:
- a memory cell;
- a local input/output line;
- a column select gate configured to control transfer of data from the memory cell to the local input/output line;
- a local input/output line sense amplifier configured to sense and amplify data on the local input/output line in response to a local input/output line sense amplifier enable signal;
- a global input/output line configured to receive the sensed and amplified data;
- a global input/output line sense amplifier configured to sense and amplify the data on the global input/output line responsive to a global input/output line sense amplifier enable signal; and
- a control circuit configured to disable the local input/output line sense amplifier and disable data transfer via the column select gate responsive to the global input/output line sense amplifier enable signal.

7. The memory device of claim 6, wherein the local input/output line sense amplifier is configured to sense and amplify data on the local input/output line responsive to a local input/output line sense amplifier enable signal, and wherein the control circuit is configured to control the local input/output line sense amplifier enable signal responsive to the global input/output line sense amplifier enable signal.

8. The memory device of claim 6, further comprising a column selector circuit configured to control the column select gate responsive to the global input/output line sense amplifier enable signal.

9. The memory device of claim 8, wherein the control circuit comprises:
- a NOR gate configured to NOR the global sense amplifier enable signal and a column selector disable signal; and
- an inverter configured to invert an output of the NOR gate to produce an enable signal for the column selector circuit.

10. The memory device of claim 9, further comprising a local input/output line sense amplifier enable signal generator circuit that also receives the enable signal produced by the inverter and that generates the local input/output line sense amplifier enable signal responsive thereto.

11. A method of operating a memory device that includes a memory cell, memory circuitry configured to transfer data from the memory cell to a local input/output line, a local input/output line sense amplifier configured to sense and amplify data on the local input/output line and a global input/output line sense amplifier configured to sense and amplify data produced on a global input/output line coupled to the local input/output line sense amplifier, the method comprising:
- enabling the local input/output line sense amplifier to sense and amplify data on the local input/output line and thereby produce data on the global input/output line;
- enabling the global input/output line sense amplifier to sense and amplify the data on the global input/output line; and
- disabling the local input/output line sense amplifier responsive to the enabling of the global input/output line sense amplifier.

12. The method of claim 11, wherein enabling the global input/output line sense amplifier comprises enabling the global input/output line sense amplifier responsive to a transition of a global input/output line sense amplifier enable signal, and wherein disabling the local input/output line sense amplifier responsive to the enabling of the global input/output line sense amplifier comprises disabling the local input/output line sense amplifier responsive to the transition of the global input/output line sense amplifier enable signal.

13. The method of claim 11, wherein the memory circuitry further includes a column selection gate configured to enable and disable transfer of data to the local input/output line, and wherein the method further comprises disabling transfer of data via the column selection gate responsive to the enabling of the global input/output line sense amplifier.

14. The method of claim 13, wherein enabling the global input/output line sense amplifier comprises enabling the global input/output line sense amplifier responsive to a transition of a global input/output line sense amplifier enable signal, and wherein disabling transfer of data via the column selection gate responsive to the enabling of the global input/output line sense amplifier comprises disabling transfer of data via the column selection gate responsive to the transition of the global input/output line sense amplifier enable signal.

* * * * *